United States Patent [19]

Jensen

[11] 4,377,755
[45] Mar. 22, 1983

[54] SIGNAL COMPRESSOR APPARATUS

[75] Inventor: William E. Jensen, San Pedro, Calif.

[73] Assignee: The United States of America as represented by the Secretary of the Air Force, Washington, D.C.

[21] Appl. No.: 169,231

[22] Filed: Jul. 15, 1980

[51] Int. Cl.³ .................... G11C 19/28; H01L 29/78; H03K 3/42
[52] U.S. Cl. ........................................ 377/63; 357/24; 307/311
[58] Field of Search ........................ 357/24 R, 24 LR; 307/221 D, 311

[56] References Cited

U.S. PATENT DOCUMENTS 3,953,733  4/1976  Levine ........................... 357/24 LR Primary Examiner—Gene M. Munson
Attorney, Agent, or Firm—Donald J. Singer; William Stepanishen

[57] ABSTRACT

A signal compressor apparatus utilizing a charge coupled device having a charge storage well wherein the charge storage capacity is variable over the integration time of the device. During the minimum charge storage period, the input charge which exceeds an established limit is dumped, thereby providing compression of the input signal.

8 Claims, 5 Drawing Figures

SIGNAL COMPRESSOR APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to charge coupled devices, and in particular to a charge coupled device providing signal compression of the input charge over the integration period of the device.

The charge coupled device generally comprises a plurality of electrodes which are provided on a thin insulating film that is provided on a semiconductor substrate for applying an intergration voltage to the integration electrodes during an integration period to cause potential wells to be produced in the semiconductor substrate. Information carrier charge is introduced to the device to be integrated in the potential well and by applying a transfer pulse to all of the electrodes including the integration electrodes during the succeeding transfer period to cause the information carrier charge to be transferred in a prescribed direction. The information carrier charge is sequentially read from the output terminal of the end position of the charge coupled device. The charge coupled device thus entails means for integrating, means for transferring, and means for reading out the applied input charge information.

SUMMARY OF THE INVENTION

The present invention utilizes a charge coupled device having a plurality of gates for compressing high level input signals. The input charge from a detector or gate modulator is transferred over a barrier under a first gate to a storage well under a second gate. A sawtooth voltage waveform which is applied to the second gate provides the storage well with minimum initial storage capacity at the beginning of the integration time, and at the end of the integration time, with maximum storage capacity. The peak-to-peak voltage of the sawtooth waveform determines the breakpoint of the gain curve. Any incoming charge which exceeds the expanding charge rate of the storage well under the second gate spills over a second barrier gate and is dumped through a dump charge gate. A save charge gate which is the compliment of the dump charge gate is activated just prior to the end of the sawtooth waveform to save spilled charge for addition to the stored charge. When the storage well potential moves upward at the end of the integration time, the charge in the storage well is transferred over the barrier under the third gate and is combined with the spilled charge for entry into the register.

It is one object of the present invention, therefore, to provide an improved signal compressor apparatus.

It is another object of the invention to provide an improved signal compressor apparatus wherein high level signals may be compressed 20 db or more.

It is another object of the invention to provide an improved signal compressor apparatus wherein the breakpoint of the input charge gain curve is equal to the peak to peak voltage of the storage well signal.

It is yet another object of the invention to provide an improved signal compressor apparatus wherein the duty cycle of the complimentary transfer gates varies the slope of the compression portion of the input charge gain curve.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
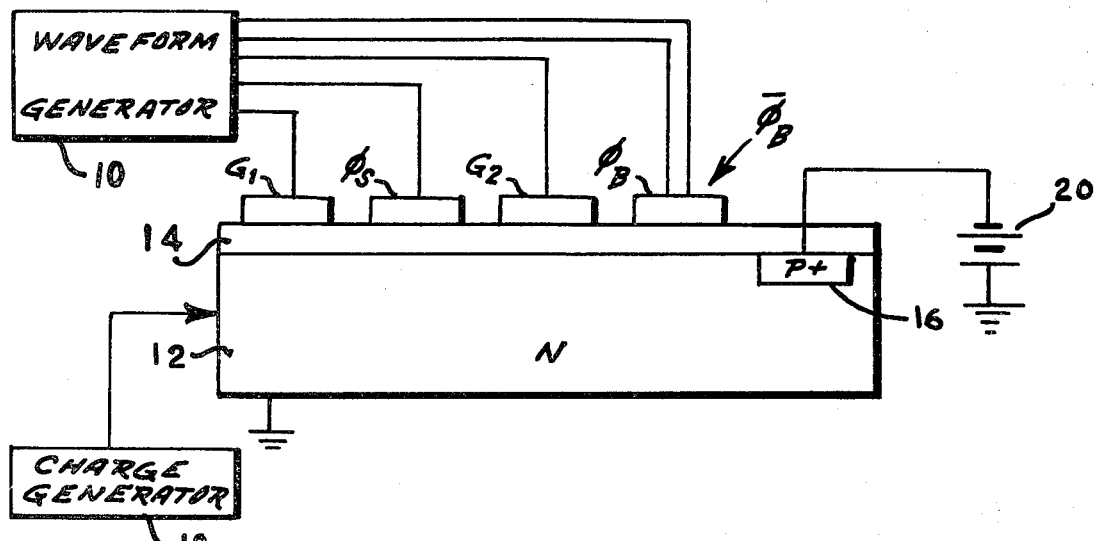
FIG. 1 is a side view of the signal compressor apparatus in a charge coupled device in accordance with the present invention.

Referring now to FIG. 1, there is shown a signal compressor apparatus in a charge coupled device wherein a plurality of gate electrodes, $G_1$, $G_2$, $\overline{\phi}_B$, $\phi_B$ and $\phi_S$ are connected to a waveform generator 10. The charge generator unit 18 injects an input charge $Q_{in}$ into the substrate 12 under gate G1. The charge coupled device comprises an N-type substrate 12 which is grounded. An oxide layer 14 is formed on substrate 12 in the usual and conventional manner. The metal electrode gates $G_1$, $G_2$, $\overline{\phi}_B$, $\phi_B$ and $\phi_S$ may be formed either as shown on the oxide layer 14 or in the oxide layer 14 but not in electrical contact with the substrate 12. While an N-type substrate is utilized for the present example, it will be well understood that a P-type substrate may be utilized as well with the appropriate changes in potentials and material types. A dump diffusion cell 16 which is comprised of P-type material is shown imbedded in substrate 12 and contact with insulating layers 14. The dump diffusion cell 16 is connected to a source of negative potential 20. The waveform generator 10 provides the various negative potentials and waveforms to develop the surface potential profile diagram which is shown in FIG. 3.

Figure 2:
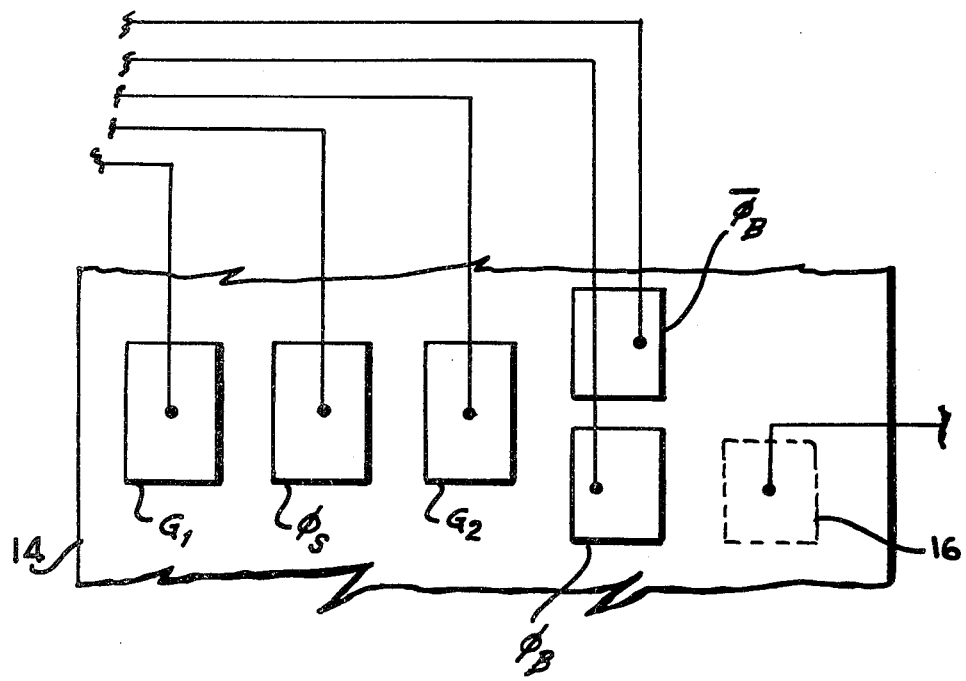
FIG. 2 is a top view of the signal compressor apparatus showing gate electrode arrangement thereon.

In FIG. 2, the arrangement of gate electrodes $G_1$, $G_2$, $\overline{\phi}_B$, $\phi_B$ and $\phi_S$ will be better understood by referring to the illustration thereof. The gate electrodes $G_1$, $\phi_S$ and $G_1$ are arranged substantially in a straight line on insulating layers. However, gate electrodes $\phi_B$, $\overline{\phi}_B$, the arrangement of which may not be clearly understood in FIG. 1, are shown adjacent to each other on insulating layer 14. As will be shown and described later herein, the gate electrodes $\phi_B$, $\overline{\phi}_B$ receive a complimentary clock pulse train which oppositely energizes these gates to provide alternate charge flow paths. The dump diffusion cell 16 is shown to establish its relationship to gate electrodes $G_1$, $G_2$ $\overline{\phi}_B$, $\phi_B$ and $\phi_S$.

Figure 3:
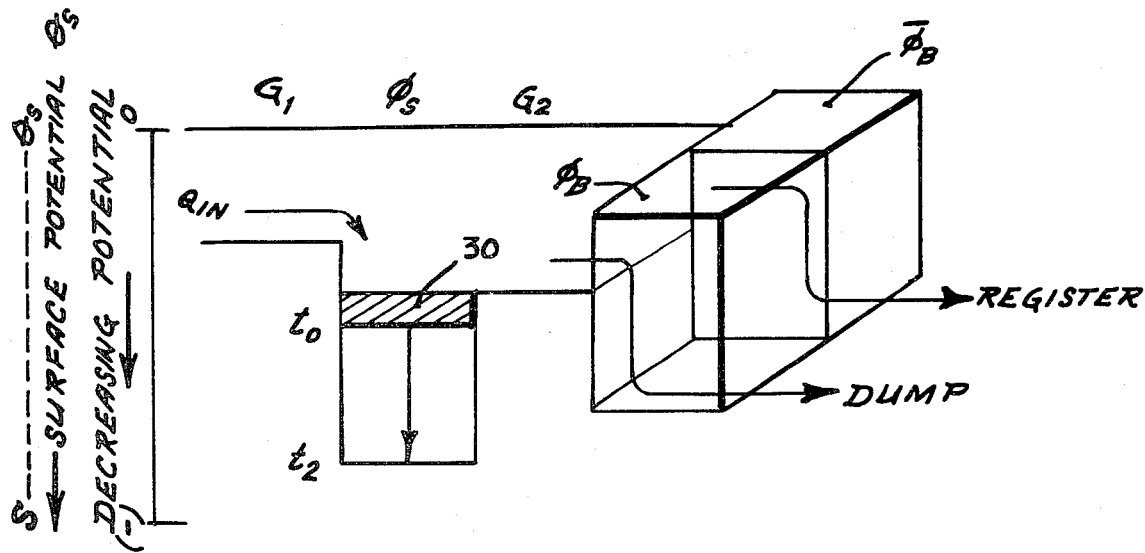
FIG. 3 is a graphical representation of the potential profile within the signal compressor apparatus.
Figure 4:
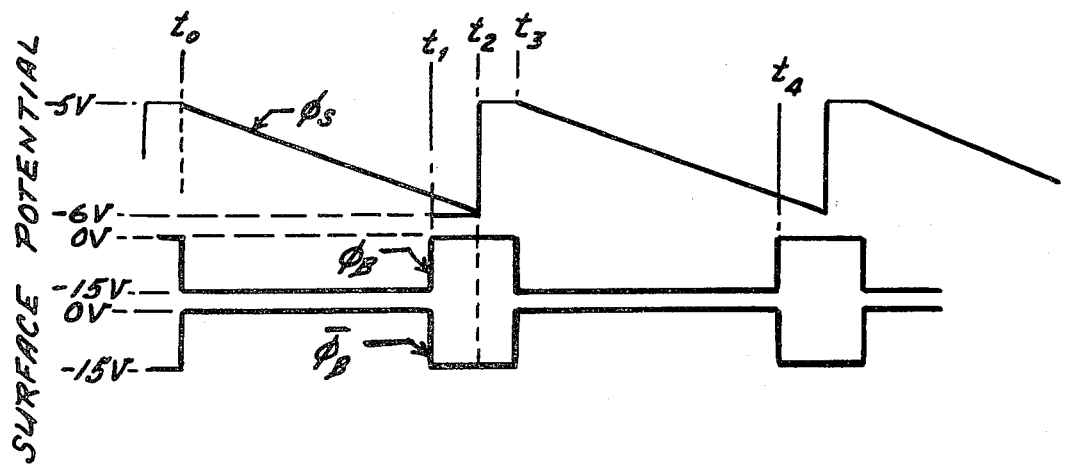
FIG. 4 is a graphical representation of the signal waveforms which are applied to the electrode gates $\phi_S$, $\phi_B$ and $\overline{\phi}_B$ of the signal compressor apparatus, and, FIG. 5 is a graphical representation of the charge input amplitude versus the charge output amplitude for the signal compressor apparatus.

Turning now to FIG. 3, there is shown the surface potential profile diagram for the present signal compressor apparatus. The surface potential has been referenced to the various gates under which the particular surface potential that is shown, is developed. The gate electrodes $G_1$, $G_2$ both receive a fixed DC bias or potential to establish a particular potential barrier level. In the present example, gate electrode $G_1$ is fixed at approximately $-1$ volt DC and gate electrode $G_2$ is fixed at approximately $-4$ volts DC. The potential profile that is developed under gate electrode $\phi_S$ is varied over the period $t_0$-$t_2$ and from approximate $-5$ volts DC to $-6$ volts DC to provide a linearly expanding charge storage well. The graphical representation of the waveform that establishes the linearly expanding charge storage well under gate electrode $\phi_S$ is shown in FIG. 4 and is labelled $\phi_S$. It may be seen that time $t_0$ time $t_2$, the potential applied to gate electrode $\phi_S$ linerary decreases from approximately $-5$ volts to $-6$ volts and then at time $t_2$ abruptly returns to the initial value. It may be noted in FIG. 3 that prior to time $t_0$, the charge storage well under gate electrode $\phi_S$ contains a precharge 30 which comprises the difference in charge between the barrier formed by gate $G_2$ and the initial or starting point of gate $\phi_S$.

The clock signal which is applied to gate electrodes $\phi_B$ and $\overline{\phi_B}$ is shown in FIG. 4. It may be noted that at time $t_0$ gate $\phi_B$ is at $-15$ volts while gate $\overline{\phi_B}$ is at zero volts. Thus, with respect to the excess charge flowing over the barrier at gate $G_2$, gate $\phi_B$ present a barrier and gate $\phi_B$ provides a path to the dump diffusion cell. The clock signal to gates $\phi_B$ and $\overline{\phi_B}$ is complimentary. At time $t_1$ just prior to the end of waveform $\phi_S$, clock signals $\phi_B$ and $\overline{\phi_B}$ switch, thereby preventing charge from passing under gate $\phi_B$ and allowing charge to pass through gate $\overline{\phi_B}$.

Figure 5:
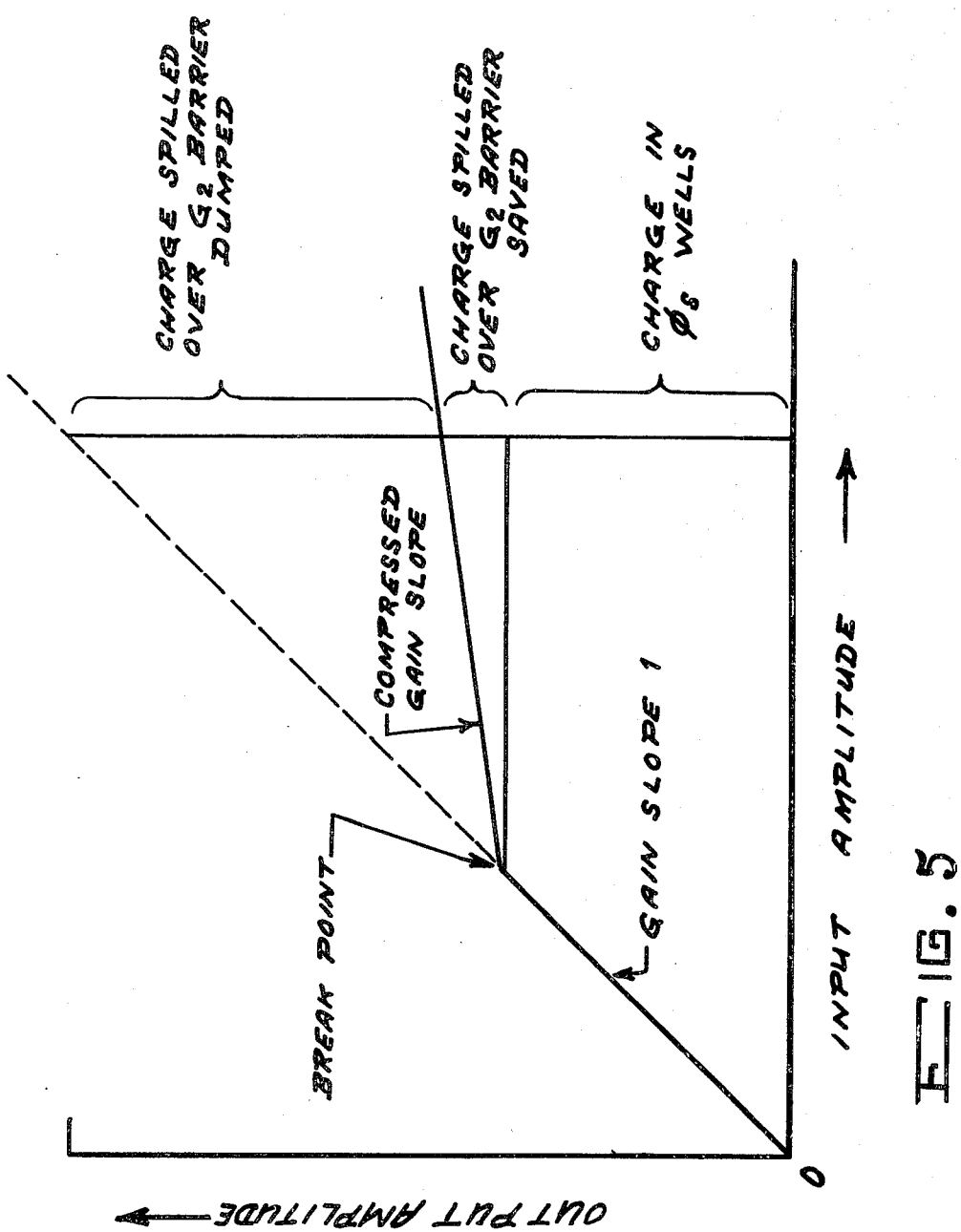

The signal compressor apparatus operates in the following manner. It is assumed that the charge signal that is applied to the charge coupled device has a linearly increasing charge rate with amplitude, i.e. the charge signal is constant over the integration time of the charge coupled device. The input charge $Q_{in}$ is either generated in a detector adjacent to the charge coupled device or applied to the charge coupled device via a gate modulator. The input charge $Q_{in}$ is fed over the barrier under gate electrode $G_1$ into the storage well under gate $\phi_S$. A sawtooth voltage waveform drives gate $\phi_S$ so that at the beginning of the integration time to the $\phi_S$ storage well, the well $\phi_S$ has its minimum charge storage capacity and at the end of the integration time $t_2$, the storage well $\phi_S$ has its maximum storage capacity. The peak to peak voltage of the applied clock $\phi_S$ determines the break point of the gain curve which is shown in FIG. 5 as a graph of the output amplitude versus the input amplitude. It may be noted that the higher the value of the applied voltage provides a higher break point voltage. If the detector signal is at the level of the break point, the constant $Q_{in}$ charge moving over barrier gate electrode $G_1$ during the integration time will exactly equal the increasing charge storage capacity of storage well $\phi_S$. Therefore, no charge spills over barrier gate, $G_2$ and storage well $\phi_S$ is filled to exactly the level of the barrier under gate electrode $G_2$. The output signal now is in storage well $\phi_2$. At time $t_2$, the sawtooth waveform makes the rapid transition so as to move the storage well bottom potential upward to its original level thus displacing the charge in the storage well $\phi_S$ upward and therefore, allowing the charge to transfer over barrier gate $G_2$. At this time, charge which is transferring over gate electrode $G_2$ is addressed to the register, as shown in FIG. 3, due to the clock pulses (shown in FIG. 4) enabling gate $\overline{\phi_B}$ and disabling gate $\overline{\phi_B}$.

If the detector signal is less than the level of the break point shown in FIG. 5, the charge rate into storage well $\phi_2$ over gate $G_1$ is less than the increasing charge storage capacity of storage well $\phi_S$, and will be proportional to the input signal. However, if the detector signal is greater than the level of the break point, the rate of charge entering storage well $\phi_S$ over barrier gate $G_1$ is greater than the expanding charge capacity of well $\phi_S$. Therefore, the charge will first fill the storage well $\phi_S$ and the excess charge will spill over barrier gate $G_2$. The attenuation of the signal flowing over barrier gate $G_2$, or the slope of the gain curve is proportional to the percentage of the signal which is later combined under gate $\overline{\phi_B}$ with the signal in storage well $\phi_S$ at time $t_2$. The attenuation of the spilled charge may be accomplished by either varying a clocking ratio of charge dumped to charge saved, (as represented by waveform $\phi_B$ and $\overline{\phi_B}$ in FIG. 4), or by varying duty cycles of addressing clocks which address charge coming over barrier gate $G_2$ to either a charge dump cell or to the register during time the register receives signals. The $\phi_S$ clock makes a transition upwards forcing the charge in that storage well over barrier gate $G_2$ and combining it with the attenuated, spilled charge, for entry into the register.

The signal compressor apparatus eliminates threshold variation errors by precharging the storage well $\phi_S$ at time $t_0$ i.e., the well potential of storage well $\phi_S$ at time $t_0$ is lower than that of barrier gate $G_2$ by approximately 0.5 to 1 volt. This large difference will allow compensation for threshold variation from circuit to circuit. The charge from $Q_{in}$ will initially provide this precharge.

This invention can be applied also to the Bucket Brigade Device. This invention is not limited to the channel type (P channel or N channel), driving system (single phase, two phase or three phase driving systems), and electrode arrangement (one dimensional or two dimensional arrangements) of the charge transfer device.

Although the invention has been described with reference to a particular embodiment, it will be understood to those skilled in the art that the invention is capable of a variety of alternative embodiments within the spirit and scope of the appended claims.

What is claimed is:

1. In a charge transfer device, a charge coupled device which comprises a semiconductor substrate with an insulating material deposited thereon and a plurality of gate electrodes provided on or within said insulating material and driving means for driving said plurality of gate electrodes, the improvement comprising a signal compressor means for compressing an input signal wherein a first gate electrode means receives a first fixed bias from said driving means to provide a first potential barrier, a second gate electrode means receives a voltage waveform with a predetermined linear slope from said driving means to provide a variable charge storage well, a third gate electrode means receives a second fixed bias from said driving means to provide a second potential barrier, said second potential barrier being lower than said first potential barrier; and a pair of adjacent gate electrodes next to said third gate electrode means to receive complementary clock pulses from said driving means, one of said pair of adjacent gate electrodes being an output gate which is connected to an output register, the other of said pair of adjacent gate electrodes being a dump gate which is connected to a dump diffusion means for dumping excess charge, said signal compressor means receiving an input charge with a linear charge rate, said input charge passing over said first potential barrier and into said storage well, the excess of said input charge passing over said second potential barrier and through said dump gate electrode to said dump diffusion means during the intitial portion of the integration period, near the end of the integration period, said clock pulses to said pair of adjacent gate electrodes reverses and enables said output gate wherein any excess charge therein is combined with the charge in said storage well and applied to said output register.

2. A signal compressor means as described in claim 1 wherein said voltage waveform is a sawtooth signal.

3. A signal compressor means as described in claim 2 wherein said sawtooth signal varies linearly from −5 volts to −6 volts.

4. A signal compressor means as described in claim 2 wherein the peak to peak level of said sawtooth signal determines the breakpoint in said input charge transfer curve.

5. A signal compressor means as described in claim 1 wherein the duty cycle of said clock pulses to said dump gate determines the amount of charge dumped.

6. A signal compressor means as described in claim 1 wherein the duty cycle of the said clock pulses to said output gate determines the amount of charge saved.

7. A signal compressor means as described in claim 1 wherein said first fixed bias is −1 volts DC and said second fixed bias is −4 volts DC.

8. In an electronic system including a charge coupled device, said charged coupled device having an input and an output, a semiconductor substrate with an insulating material deposited thereon, first, second and third gate electrodes serially arranged between said input and said output and a pair of adjacent gate electrodes between said third gate electrode of said output, the improvement residing in signal compressing means, said signal compressing means comprising signal generation means for driving said gate electrodes and delivering:

a first fixed bias to said first gate electrode to provide a first potential barrier, a voltage waveform with a predetermined linear slope to said second gate electrode to provide a variable charge storage well, a second fixed bias to said third gate electrode to provide a second potential barrier, said second potential barrier being lower than said first potential barrier; and complementary clock pulses to said adjacent gate electrodes, one of said pair of adjacent gate electrodes being an output gate which is connected through said output to an output register, the other of said pair of adjacent gate electrodes being a dump gate which is connected to a dump diffusion means, said signal compressing means receiving an input charge with a linear charge rate, said input charge passing over said first potential barrier and into said storage well, the excess of said input charge passing over said second potential barrier and through said dump gate to said dump diffusion means during the initial portion of the integration period, near the end of the integration period, said clock pulses to said pair of adjacent gate electrodes reverses and enables said output gate wherein any excess charge therein is combined with the charge in said storage well and applied to said output register.

* * * * *